US007105118B2

(12) United States Patent
Narayan et al.

(10) Patent No.: US 7,105,118 B2
(45) Date of Patent: Sep. 12, 2006

(54) METHODS OF FORMING THREE-DIMENSIONAL NANODOT ARRAYS IN A MATRIX

(75) Inventors: Jagdish Narayan, Raleigh, NC (US); Ashutosh Tiwari, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 176 days.

(21) Appl. No.: 10/723,842

(22) Filed: Nov. 26, 2003

(65) Prior Publication Data

US 2004/0119064 A1    Jun. 24, 2004

Related U.S. Application Data

(60) Provisional application No. 60/430,210, filed on Dec. 2, 2002.

(51) Int. Cl.
*B82B 3/00* (2006.01)
*H01L 21/4763* (2006.01)

(52) U.S. Cl. ............... 264/210.6; 257/E51.04; 257/E51.005; 438/105; 438/778

(58) Field of Classification Search ........... 257/E51.04
See application file for complete search history.

(56) References Cited

U.S. PATENT DOCUMENTS 5,113,473 A    5/1992    Yoshida et al.
2003/0108683 A1*  6/2003  Wu .......................... 427/580
2004/0146560 A1*  7/2004  Whiteford et al. .......... 424/484
2004/0168626 A1*  9/2004  Moeck et al. ................ 117/84

FOREIGN PATENT DOCUMENTS

EP            0 977 182          2/2000

OTHER PUBLICATIONS

Alivisatos et al., "Semiconductor Clusters, Nanocrystals, and Quantum Dots," *Science* 271(5251): 933-937 (Feb. 16, 1996).
Awschalom et al., "Macroscopic Quantum Effects in Nanometer-Scale Magnets," *Science* 258(5081): 414-421 (Oct. 16, 1992).
Black et al., "Spin-Dependent Tunneling in Self-Assembled Cobalt-Nanocrystal Superlattices," *Science* 290: 1131-1134 (Nov. 10, 2000).
Carpenter et al., "Iron nanoparticles as potential magnetic carriers," *Journal of Magnetism and Magnetic Materials* 225: 17-20 (2001).
Helman et al., "Tunneling of Spin-Polarized Electrons and magnetoresistance in Granular Ni Films," *Physical Review Letters* 37(21): 1429-1432 (Nov. 22, 1976).
Koo et al., "Current-controlled bi-stable domain configurations in $Ni_{81}Fe_{19}$ elements: An approach to magnetic memory devices," *Applied Physics Letters* 81(5): 862-864 (Jul. 29, 2002).
Lambeth et al., "Media for 10 $Gb/in.^2$ hard disk storage: issues and status (invited)," *J. Appl. Phys.* 79(8): 4496-4501 (Apr. 15, 1996).

(Continued)

*Primary Examiner*—David Nelms
*Assistant Examiner*—Dao H. Nguyen
(74) *Attorney, Agent, or Firm*—Myers Bigel Sibley & Sajovec, PA

(57) ABSTRACT

Nanostructures and methods of making nanostructures having self-assembled nanodot arrays wherein nanodots are self-assembled in a matrix material due to the free energies of the nanodot material and/or differences in the Gibb's free energy of the nanodot materials and matrix materials.

23 Claims, 12 Drawing Sheets

OTHER PUBLICATIONS

MacLachlan et al., "Shaped Ceramics with Tunable Magnetic Properties from Metal-Containing Polymers," *Science* 287: 1460-1463 (Feb. 25, 2000).

Makeev et al., "Simulations of Atomic Level Stresses in Systems of Buried Ge/Si Islands," *Physical Review Letters* 86(24): 5542-5545 (Jun. 11, 2001).

Mazaleyrat et al., "Ferromagnetic nanocomposites," *Journal of Magnetism and Magnetic Materials* 253-259 (2000).

Middleton et al., "Collective Transport in Arrays of Small Metallic Dots," *Physical Review Letters* 71(19): 3198-3201 (Nov. 8, 1993).

Moodera et al., "Optimum tunnel barrier in ferromagnetic-insulator-ferromagnetic tunneling structures," *Appl. Phys. Lett.* 70(22): 30503052 (Jun. 2, 1997).

Müller et al., "Electrically controlled light scattering with single metal nanoparticles," *Applied Physics Letters* 81(1): 171-173 (Jul. 1, 2002).

Peng et al., "Characteristic transport properties of CoO-coated monodispersive Co cluster assemblies," *Physical Review B* 60(3): 2093-2010 (Jul. 15, 1999).

Puntes et al., "Colloidal Nanocrystal Shape and Size Control: The Case of Cobalt," *Science* 291: 2115-2117 (Mar. 16, 2001).

Sheng et al., "Hopping Conductivity in Granular Metals," *Physical Review Letters* 31(1): 44-47 (Jul. 2, 1973).

Stahl et al., "Electronic and Magnetic Properties of Monodispersed FePt Nanoparticles," *Adv. Mater.* 14(1): 24-27 (Jan. 4, 2002).

Invitation to pay Additional Fees/Partial International Search Report for International Application No. PCT/US03/40150 mailed on Apr. 29, 2005.

PCT Notification of Transmittal of the International Search Report for International Application No. PCT/US03/40150; Mailed Jun. 23, 2005.

* cited by examiner

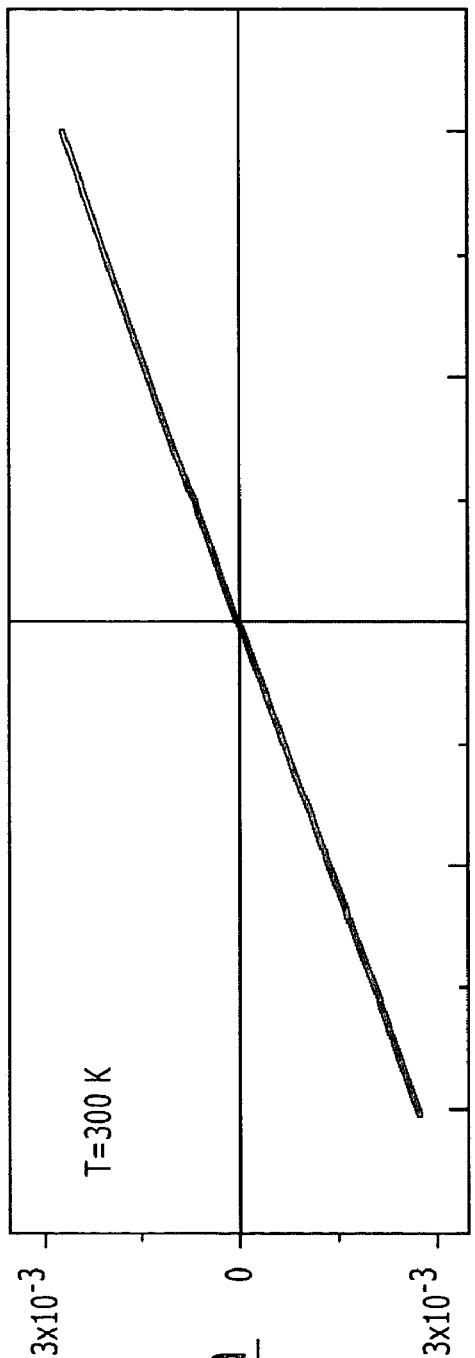
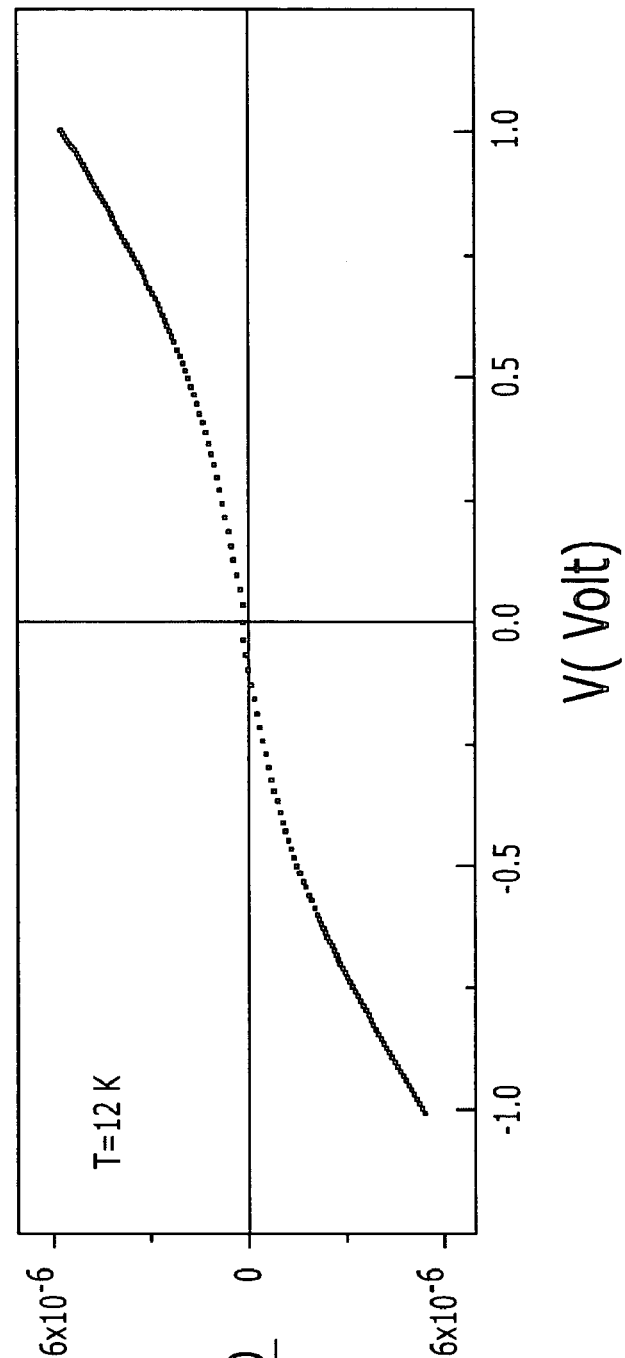
FIG. 13a
FIG. 13b

METHODS OF FORMING THREE-DIMENSIONAL NANODOT ARRAYS IN A MATRIX

CROSS-REFERENCE TO RELATED APPLICATIONS

This application claims the benefit of, and incorporates herein by reference in its entirety, the following United States Provisional Application: U.S. Provisional Application No. 60/430,210 filed Dec. 2, 2002.

STATEMENT OF GOVERNMENT SUPPORT

This invention was made with support from the United States Federal government under grant number 5-39207 from the National Science Foundation. The United States government has certain rights in this invention.

FIELD OF THE INVENTION

The present invention relates to the formation of quantum structures on substrates and in particular to the self-assembly of nanostructure arrays in a matrix material.

BACKGROUND OF THE INVENTION

In recent years, research into nanotechnology has been increasing. Of particular interest is the research into nano-magnetic materials, which may be used for such things as magnetic storage media, nonvolatile memory cells, ferrofluid technology, magnetocaloric refrigeration, biotechnology, and lighting systems, to name a few.

The formation of regular arrays of uniformly distributed ferromagnetic nanoparticles in a matrix material may provide opportunities for reducing the size of magnetic storage media while significantly increasing the storage capacity of such devices. For example, magnetic storage media having bit densities exceeding 10 $Tbit/in^2$ could theoretically be formed from a nanostructure having regular arrays of uniformly distributed magnetic nanoparticles in a matrix material.

Many methods have been developed to fabricate nonostructures having arrays of nanoparticles. For instance, electron-beam lithography methods in the range of 100 nm and above have been developed to create arrays of magnetic nanoparticles. Chemical routes have also been explored wherein a layer-by-layer self-assembly of magnetic nanoparticles are formed. In the chemical self-assembly methods, however, only one or two monolayers may be produced, resulting in nanostructures having two-layers of nanoparticle arrays. Furthermore, many of the currently available methods are expensive and involve multi-step processes including the repetitive formation of resists, energy beam exposure, etching, lift-off, and/or encapsulation.

It is therefore desirable to develop methods for constructing nanostructures with less than 100 nm size and having multiple arrays of uniformly distributed nanoparticles, where size and number density can be controlled precisely. It is particularly desirable to develop methods for forming structures having more than two layers of nanoparticle arrays. Further, methods involving fewer steps than those presently available are desired.

SUMMARY OF THE INVENTION

Embodiments of the present invention involve the formation of nanostructures and particularly nanostructures including arrays of nanoparticles such as nanodots. According to embodiments of the present invention, multiple layers of nanodots may be formed through a self-assembly process and surrounded by a matrix material. The self-assembly of the nanodots can create arrays of uniformly distributed nanodots upon which additional layers of arrays of uniformly distributed nanodots may be formed.

According to some embodiments, the nanodots and matrix material are formed sequentially. A nanodot material may be deposited on a substrate by ablating a target of the material in a deposition chamber holding a substrate, such as silicon. The ablation of the nanodot material target forms a few monolayer of the nanodot material on the substrate. The nanodot material layer clusters and self-assembles into uniformly dispersed nanodots on the substrate. This self-assembly results from the minimization of free energy in the nanodot material layer, which may involve elastic interactions.

A matrix material may then be deposited over the self-assembled nanodots by ablating a target of the matrix material in the deposition apparatus. The matrix material fills in around the nanodots, forming a layer of matrix material with an array of uniformly dispersed nanodots in the matrix material.

Additional layers of nanodot material may be formed, self-assembled, and covered by matrix material to form nanostructures having multiple layers of uniformly dispersed nanodots in a matrix material. According to some embodiments of the present invention, the entire nanostructure formation process may take place in a single deposition apparatus without the need for additional processing steps between each deposition.

According to other embodiments, the nanodots and matrix materials are formed simultaneously, wherein the nanodots self-assemble within the matrix material. In such embodiments, a nanodot material and a matrix material are deposited on a substrate simultaneously, such as by ablation of an alloy target of a nanodot material and a matrix material or by ablation of two or more targets of those materials. The nanodot material and matrix material are selected such that the Gibb's free energy of oxidation of the matrix material is lower than that of the nanodot material. This can result in the spontaneous reaction of the matrix material with oxygen before the nanodot material will react with oxygen. The ablation may be formed in the presence of oxygen, such that the matrix material deposited on the substrate begins to react with oxygen, thereby forming an oxidized matrix material. At the same time, the nanodot material in the matrix material clusters and self-assembles into nanodots within the matrix material. This self-assembly may result from the minimization of free energy in the layer of nanodot material and matrix material. The self-assembly of nanodots and oxidization of matrix material forms an array of uniformly dispersed nanodots in a matrix material over the substrate.

Additional layers of nanodot material and matrix material may be applied to the previously formed layer of nanodots and matrix material to form consecutive layers of nanodots in matrix material. In this manner, nanostructures having multiple layers of uniformly dispersed arrays of nanodots in matrix materials may be formed. The rapid deposition of materials, self-assembly of nanodots, and oxidation of matrix material allows for the rapid production of multi-layered nanostructures with layers of uniformly dispersed arrays of nanodots.

According to embodiments of the present invention, the matrix material may be an amorphous material. Nanodots formed in an amorphous matrix material may be randomly oriented with respect to each other. In other embodiments, the matrix material may be crystalline, wherein the nanodots are aligned in the matrix material. This alignment may result in the optimization of magnetic properties of the nanodots.

BRIEF DESCRIPTION OF THE DRAWING FIGURES

The invention can be more readily ascertained from the following description of the invention when read in conjunction with the accompanying drawings in which:

FIG. 13a illustrates the I–V characteristics at 300 K of a nanodot structure formed according to embodiments of the present invention;

FIG. 13b illustrates the I–V characteristics at 12 K of a nanodot structure formed according to embodiments of the present invention.

DETAILED DESCRIPTION OF THE INVENTION

Figure 1:
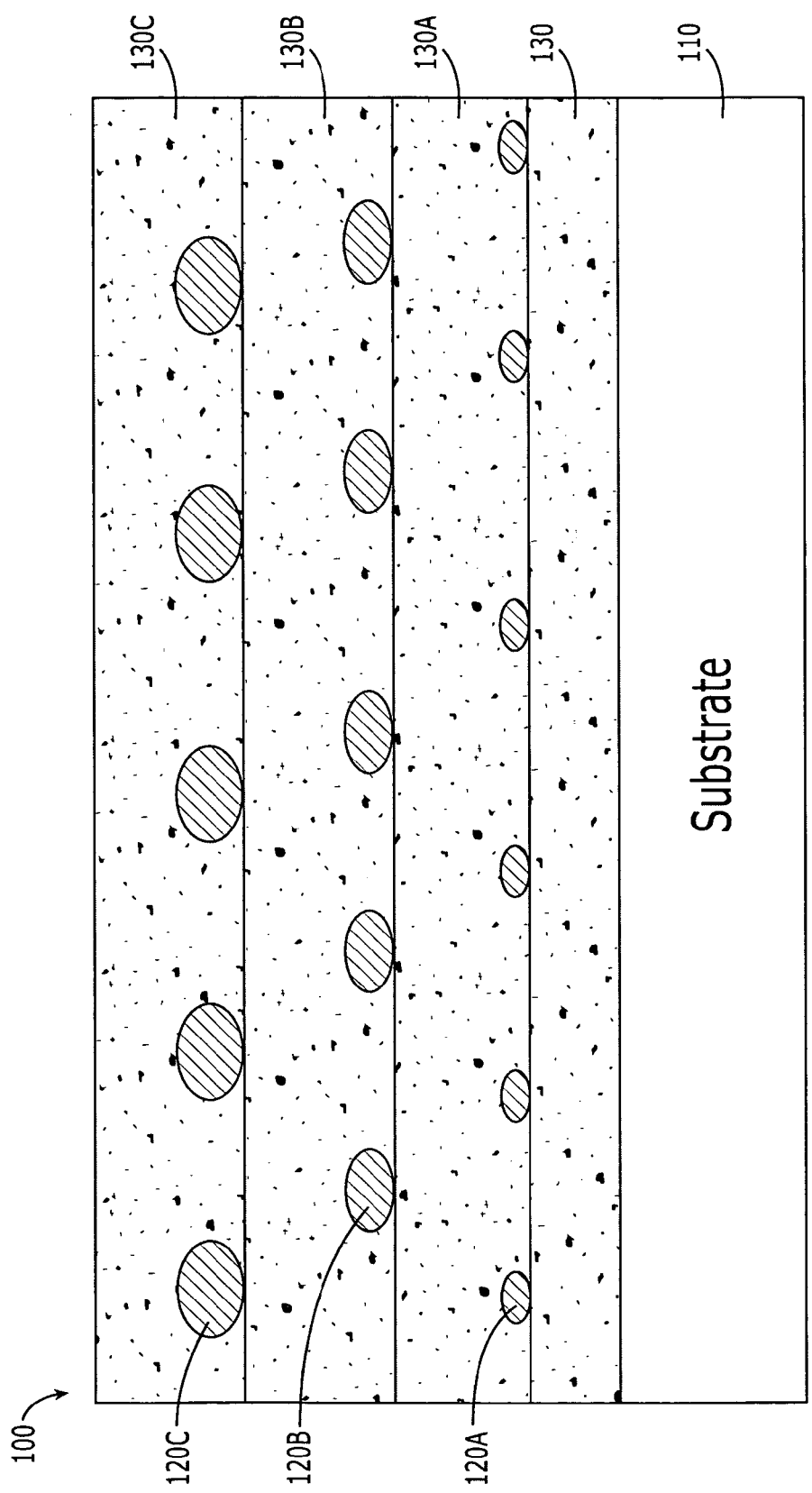
FIG. 1 illustrates a schematic diagram of multiple nanodot arrays surrounded by a matrix material according to embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will convey the scope of the invention to those skilled in the art. In the drawings, the thickness of layers and regions may be exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

According to embodiments of the present invention, nanodots of a particular substance may be formed on a substrate by self-assembly. The self-assembly of the nanodots on the substrate may be altered by controlling the environment in which the nanodot material is deposited on a substrate and/or by selecting the methods used to deposit the nanodot material on a substrate.

The term "nanodot" refers to nanostructures having a spherical or "dot" form. The term is used herein to describe certain aspects of the present invention and includes quantum structures and/or nanostructures having spherical or "dot" shapes with sizes that are measured on a nanoscale. However, embodiments of the present invention are not limited to "nanodots" and may include quantum structures and/or nanostructures having different shapes. Although the term "nanodot" is used to describe embodiments of the present invention, it is understood that those embodiments may also be formed with alternatively shaped nanostructures and that the term "nanodot" is not meant to be limiting.

Embodiments of the present invention include structures comprising layers of self-assembled nanodots. The layers of self-assembled nanodots may include matrix materials or other materials formed between and/or around the nanodots. According to some embodiments, nanodots and matrix materials are sequentially formed on a substrate. During sequential formation, a nanodot material is deposited on a substrate and it undergoes a self-assembly process to form nanodots. A matrix material is then deposited around and/or on the self-assembled nanodots. Repeating the sequential deposition of nanodot materials and matrix materials forms multiple layers of nanodots in matrix material. In other embodiments, nanodot materials and matrix materials may be simultaneously deposited as a single layer on a substrate. The nanodot material self-assembles into nanodots within the matrix material. Additional layers of nanodots and matrix material may be formed over previously formed layers of nanodots to create multi-dimensional nanostructures such as three-dimensional nanostructures.

According to embodiments of the present invention, uniformly distributed, self-assembled, nanodots may be formed on a substrate and surrounded and/or covered by a matrix material. Repetitive sequential formation of nanodots and matrix material forms a nanostructure having layers of nanodots encased in a matrix material.

For instance, FIG. 1 illustrates a schematic diagram of a structure 100 formed according to embodiments of the present invention. The structure 100 includes a substrate 110 having nanodots 120 and matrix materials 130 formed on the substrate 110. As illustrated, the nanodots 120 may be encased in or surrounded by the matrix material 130. The nanodots 120 may also vary in size as evidenced by the three different sizes of nanodots 120A, 120B, and 120C disposed over the substrate 110. In other embodiments, the same size and/or random size nanodots 120 may be provided.

According to embodiments of the present invention, a structure 100 such as that illustrated in FIG. 1 may be formed by depositing nanodots 120 on the substrate 110 followed by the deposition of a matrix material 130 over and around the nanodots 120. The sequential formation of nanodots 120 and matrix materials 130 may be repeated, thereby forming layers of nanodots 120 and matrix materials 130 over a substrate.

Figure 2:
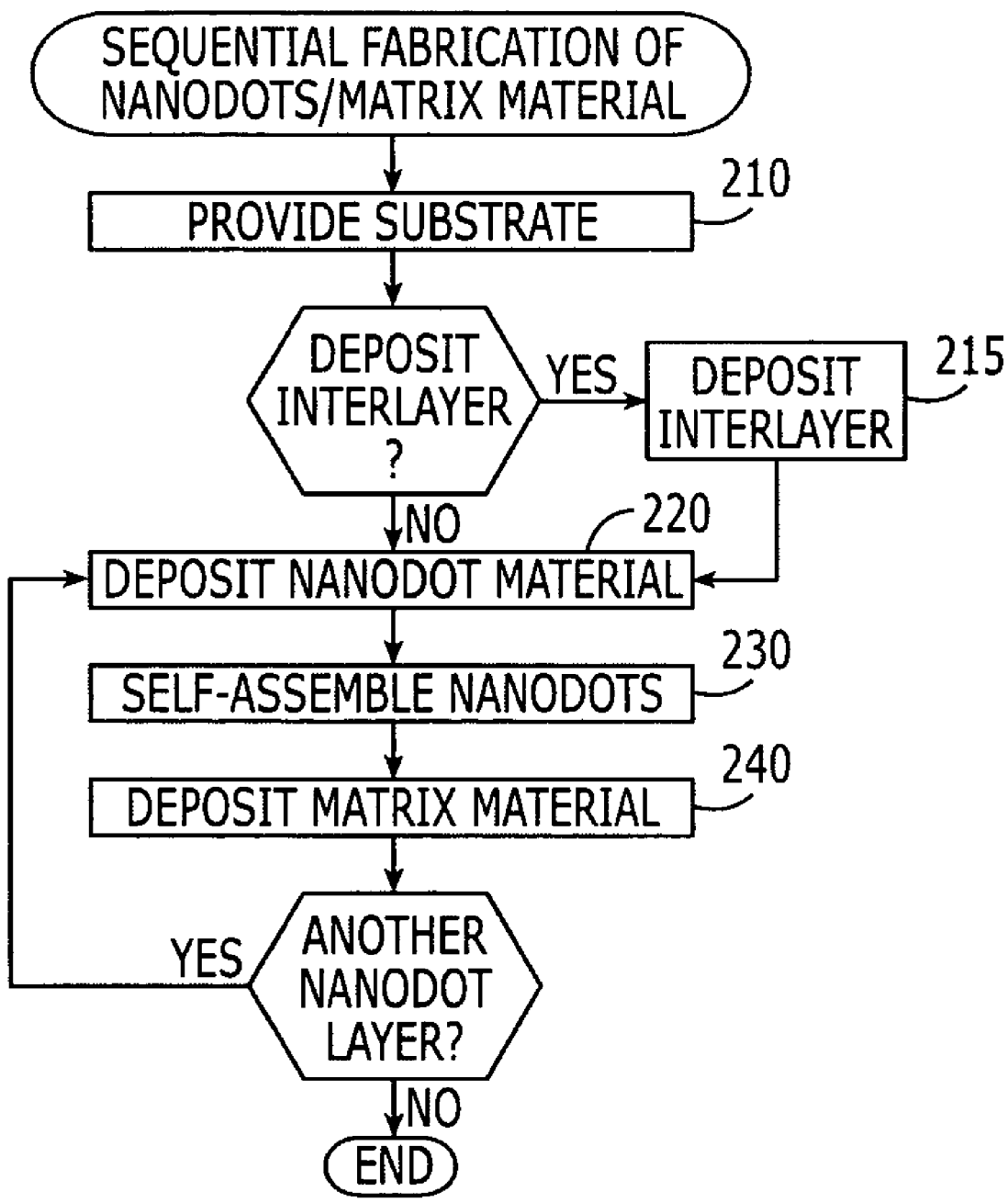
FIG. 2 illustrates a process flow diagram for sequentially forming nanodots and matrix materials according to embodiments of the present invention.

FIG. 2 illustrates a process flow diagram representing methods that may be used to sequentially form nanodots and matrix materials on a substrate according to embodiments of the present invention. A substrate is provided in step 210. If nanodots are to be deposited directly on the substrate a nanodot material deposition process is performed in step 220. However, if one or more intervening layers are desired between the nanodots and the substrate, an intervening layer deposition step 215 is performed prior to the nanodot material deposition process in step 220. Following the deposition of the nanodots, a self-assembly step 230 occurs. A matrix material is then deposited over the nanodots in step 240. If the deposition of additional nanodots and matrix materials are desired, steps 220, 230 and 240 may be repeated. In this manner, a three-dimensional structure 100 such as that illustrated in FIG. 1 may be formed.

The substrates provided in step 210 may include any substrates on which it is desirable to deposit nanodots, including semiconductor substrates, conductive substrates, and/or insulating substrates. For example, nanodots and matrix materials may be deposited on a monocrystalline silicon or sapphire substrate that is used conventionally in the production of semiconductors.

In some instances, it may be desirable to form an intervening layer between a substrate and a nanodot layer. In those instances, an intervening layer may be deposited on the substrate in step 215 prior to depositing nanodot material on the substrate in step 220. In some embodiments, the substrate may be provided in step 210 already having intervening layers deposited thereon. For example, the structure 100 illustrated in FIG. 1 includes a substrate 110 and a layer of matrix material 130 upon which the nanodots 120 are deposited. The substrate 100 and matrix material 130 may be provided in step 210 of the process illustrated in FIG. 2 or the layer of matrix material 130 may be deposited as an intervening layer in step 215 of the deposition process.

Nanodots are formed on a substrate or intervening layer through a combination of the nanodot material deposition process 220 and the nanodot self-assembly process 230. During the nanodot material deposition process 220, a nanodot material is applied to a substrate, forming at least one layer of the nanodot material over a portion of the substrate. The layer of nanodot material may include a monolayer of the nanodot material or multiple monolayers of the nanodot material over one another. Once formed, atoms of the nanodot material begin to cluster, triggering the self-assembly of the nanodot material into an array of nanodots on the substrate. The self-assembly of the nanodot material results in a two-dimensional array of uniformly dispersed nanodots on the surface of the structure to which the layer of nanodot material was applied.

The nanodot self-assembly process 230 may be driven by the strain free energy of the system, which may involve elastic interactions. As the strain free energy of the system is minimized, the clustering nanodot material forms individual nanodots having spherical shapes. Thus, once deposited, the nanodot material begins to cluster and form self-assembled nanodots. The size and shape of the nanodots in the matrix material may also be altered by the selection and formation of the matrix material. Spherically shaped nanodots may be realized when the intervening matrix layers are amorphous. If the matrix material is crystalline, the nanodots may grow epitaxially by domain matching epitaxy (J. Narayan and B. C. Larson, "Domain Epitaxy-A Unified Paradigm for Thin Film Growth, Journal of Applied Physics, Vol. 93, pp 278–85, 2003; J. Narayan U.S. Pat. No. 5,406,123, Apr. 11, 1995), wherein the nanodots acquire a definite shape based upon the crystalline nature of the matrix material.

Following the self-assembly of nanodots, a matrix material may be deposited over the nanodots. The deposition of matrix material in step 240 may include the deposition of a matrix material such that the nanodots are encased or surrounded by the matrix material. In some embodiments the matrix material may cover the nanodots and form an additional layer of matrix material over the nanodots. In other embodiments, the matrix material may only cover a portion of the nanodots, leaving a portion, such as an upper portion, of the nanodots exposed through the matrix material. In still other embodiments, the deposition of matrix material in step 240 may include the deposition of additional layers of matrix material over an initial layer, or the deposition of different matrix materials on top of a first matrix material.

According to embodiments of the present invention, the matrix material may be an amorphous material. In other embodiments, the matrix material may be crystalline, which may allow and/or facilitate the alignment of the nanodots in the matrix.

If additional nanodot layers are desired, the steps of depositing the nanodot material 220, self-assembly of the nanodots 230, and deposition of the matrix material 240 may be repeated, thereby forming a multi-layer structure 100 as illustrated in FIG. 1.

According to embodiments of the present invention, the deposition of nanodots, intervening layers, and/or matrix materials on a substrate may be performed in a deposition apparatus such as a pulsed laser deposition apparatus. Other deposition apparatuses may also be used to deposit the nanodot materials and matrix materials according to embodiments of the present invention.

Figure 3:
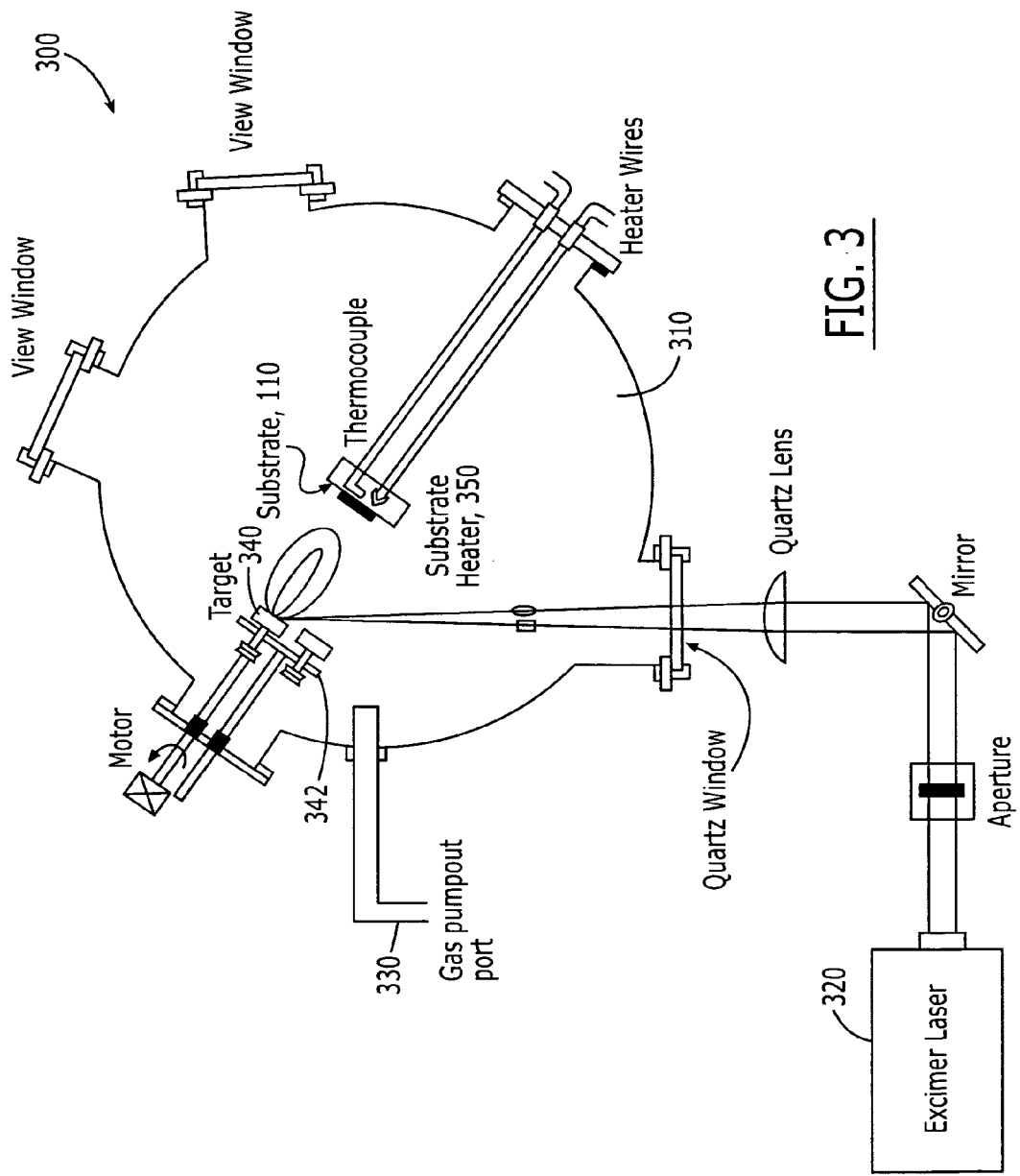
FIG. 3 illustrates a pulsed laser deposition apparatus that may be used to form nanodot arrays according to embodiments of the present invention.

An example of a pulsed laser deposition apparatus is illustrated in FIG. 3. The pulsed laser deposition apparatus 300 includes a deposition chamber 310, an excimer laser 320, and a turbo molecular pump 330. A vacuum may be maintained in the chamber using a port 335 attached to the turbo molecular pump. One or more target materials 340 may be positioned within the deposition chamber on target supports 342, which may be associated with a motor 344 for moving the targets 340 within the deposition chamber 310. One or more heater plates 350 or thermocouples may also be positioned within the deposition chamber 310 to support one or more substrates 110 upon which nanodots, matrix material, and intervening layers are to be deposited. The heater plates 350 may be connected to heating devices 352 for altering and maintaining the temperature of the heating plates 350 and substrates 110 on the heating plates 350. The pulsed laser deposition apparatus 300 may also include viewing windows 360 for viewing depositions occurring within the deposition chamber 310.

In some embodiments, the excimer laser 320 creates a laser that travels into the deposition chamber 310 through a quartz window 370. The excimer laser 320 may also include apertures, mirrors, lenses, and the like for directing, focusing, splitting, or otherwise manipulating a laser pulse from the excimer laser 320 onto one or more targets 340. In some embodiments, the incidence of the laser on a target 340 ablates a portion of the target 340, forming a plasma which expands. When the plasma contacts a substrate 110 a thin layer of the target material forms on the substrate 110. Thus, a nanodot, intervening layer, or matrix material layer may be formed on a substrate 110 by ablating a target 340 of a nanodot material, intervening layer material and/or matrix material.

For example, the structure 100 of FIG. 1 may be formed using a pulsed laser deposition apparatus 300 as illustrated in FIG. 3. A silicon substrate 110 is provided and is placed on a heater plate 350 in the deposition chamber 310. A nanodot material target 340 and a matrix material target 340 are aligned in the deposition chamber 310 parallel to the silicon substrate 110 and in such a manner that energy emitted from the excimer laser 320 may be focused on the targets 340. The structure 100 illustrated in FIG. 1 includes an intervening layer of matrix material 130 between the substrate 110 and the nanodot layers. To form an intervening layer of matrix material 130 on the silicon substrate 110 in the deposition chamber 310, energy from the excimer laser 320 is focused on the matrix material target 340 to ablate a portion of the target, creating a plasma of the target material that settles on the silicon substrate 110, forming the intervening layer of matrix material 130. The nanodots 120A in the first nanodot layer of the structure 100 are next deposited and formed. Energy from the excimer laser 320 is focused on a target 340 of nanodot material to create a plasma of the nanodot material. The plasma settles over the intervening matrix material 130 layer on the substrate 110 forming a layer of nanodot material on the matrix material 130. Once deposited, the nanodot material begins to self-assemble into spherically shaped nanodots 120A due to the tendency of the system to minimize its free energy. A matrix material layer 130A is then deposited over the nanodots 120A in the same manner as the intervening matrix material 130 layer was formed. The formation of nanodots and matrix material layers is repeated in a similar manner to create the nanodots 120B and 120C and matrix material layers 130B and 130C.

As illustrated in FIG. 1, the nanodots in each consecutive layer are different sizes. It is understood, however, that nanodots of substantially the same size and shape may be formed according to embodiments of the present invention. In some instances, however, it may be advantageous to alter the sizes of the nanodots or the spacing of the nanodots to create different characteristics for the structure 100. The sizes of the nanodots, spacing of the nanodots, and the rates and process of self-assembly may be altered by controlling the laser parameters, flux, surface energy of the structure, interfacial energy in the structure, substrate temperature, target composition, matrix material composition, and/or other parameters. For instance, the laser parameters that may be controlled include the wavelength of the laser, the pulse energy of the laser, and the repetition rate of the laser. In some embodiments, the laser wavelength may be adjusted between the ultra-violet range to the infrared range. The pulse energy density may adjusted from about 2 to about 10 $J/cm^2$ and the pulse duration set between about 1 nanosecond and 100 nanoseconds. The repetition rate of the laser may be between about 1 Hz and about 500 Hz.

The thickness of the matrix material 130 layers between the nanodot layers may also impact the formation of nanodots in consecutive layers. The self-assembly of the nanodots in a single plane, such as in the layer of nanodots 120A, may depend upon the free energy exhibited between the nanodots. If the matrix material 130A between nanodot layers is not thick enough to counter the free energy forces of an adjacent layer of nanodots, the adjacent layer may also impact the formation of subsequent nanodot layers.

The size of the nanoparticles formed and the separation between the nanoparticles in the various layers allows functionally gradient materials to be created. For example, in some embodiments the structure 100 illustrated in FIG. 1 is a schematic representing an optoelectronic system having semiconductive nanoparticles in an aluminum oxide matrix material. The smaller nanoparticles are arranged or formed closer to the substrate 110 with progressively larger nanoparticles positioned further away from the substrate 110. The formation of the different sized nanoparticles may be achieved as explained herein. The smaller nanoparticles 120A can be used to emit blue light, the nanoparticles 120B to emit green light and the larger nanoparticles 120C to emit red light. The matrix materials 130, 130A, 130B, and 130C are aluminum oxide, which is transparent. Thus, the structure 100 formed of the semiconducting nanoparticles and aluminum oxide matrix material can be used to create white light and provide a light source in the form of solid-state lighting.

In other embodiments of the present invention, the formation of nanodots in a matrix material occurs simultaneously rather than sequentially. According to such embodiments, uniformly distributed, self-assembled, nanodots may be formed within a matrix material on a substrate following the simultaneous deposition of a nanodot material and a matrix material on the substrate. The self-assembly of the nanodots occurs in a matrix material as the matrix material oxidizes. When exposed to an oxygen environment, the matrix material oxidizes more rapidly than the nanodot material, allowing the nanodots to self-assemble within the oxidized matrix material. In other embodiments, nonuniformly distributed self-assembled nanodots may be formed.

Figure 4:
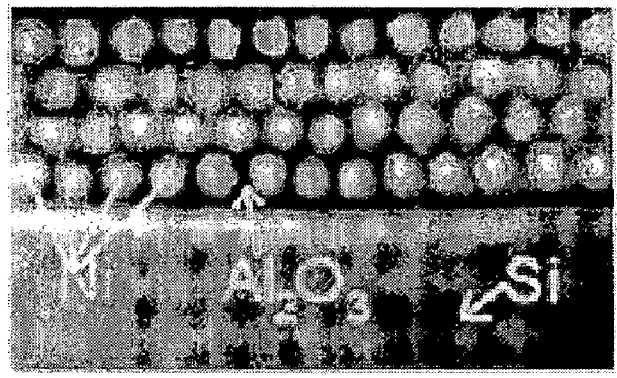
FIG. 4 illustrates a STEM-Z contrast image of nanodot array layers simultaneously formed according to embodiments of the present invention.

FIG. 4 illustrates a STEM-Z contrast image of layers of nanodots formed in a matrix material according to embodiments of the present invention. As illustrated in FIG. 4, the nanodot layers are arranged one layer over the other layer without any intervening layers. The layers of nanodots in matrix material may be used to form multi-layered nanostructures having three or more nanodot layers. According to other embodiments of the present invention, intervening layers of matrix material or other materials may be disposed between the nanodot layers.

Figure 5:
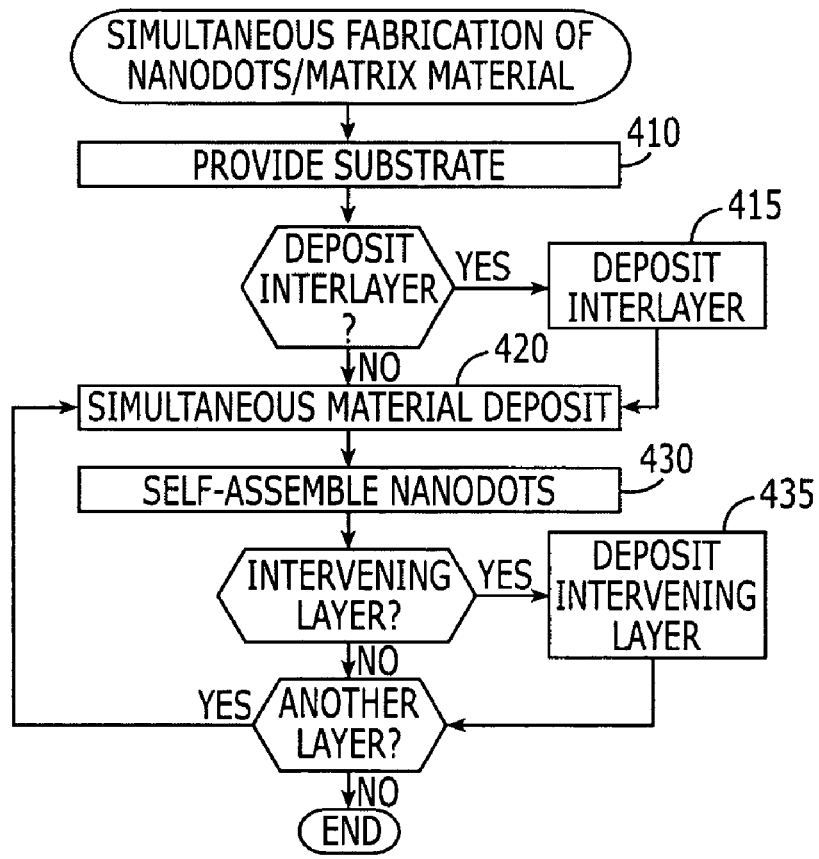
FIG. 5 illustrates a process flow diagram for simultaneously forming nanodot arrays in a matrix material according to embodiments of the present invention.

FIG. 5 illustrates a process flow diagram representing methods that may be used to simultaneously form nanodots and matrix materials on a substrate according to embodiments of the present invention. A substrate is provided in step 410. If nanodots in a matrix material are to be deposited directly onto the substrate, a simultaneous material deposition process is performed in step 420. However, if one or more intervening layers are desired between the nanodots and the substrate, an intervening layer deposition step 415 may performed prior to the simultaneous material deposition process in step 420. The simultaneous material deposition process 420 involves the simultaneous deposition of nanodot material and matrix material onto the substrate. It is understood that the nanodot material and matrix material may be precursor materials, which react in the deposition environment to form the nanodots and matrix material. Following the simultaneous material deposition 420, a nanodot self-assembly step 430 occurs wherein the nanodot material self-assembles into nanodots while the matrix material forms, such as by oxidizing with oxygen in the deposition environment. In some embodiments, the simultaneous material deposition 420 and self-assembly 430 of nanodots may occur simultaneously or at least partially overlap in time. Following nanodot self-assembly 430, an intervening layer deposition process 435 may be performed to deposit one or more layers of matrix material or other materials over the self-assembled nanodot layer. If the deposition of additional layers of nanodots and matrix material are desired, steps 420 and 430 may be repeated. In addition, intervening layer deposition processes 435 may be repeated as desired to form layers of matrix material or other materials between successive nanodot layers.

Substrates provided in step 410 may include any substrate on which it is desirable to arrange self-assembled nanodots, including semiconductor substrates, conductive substrates, and/or insulating substrates. For example, nanodots and matrix materials may be deposited over a monocrystalline silicon substrate that is conventionally used in the production of semiconductor devices.

In some instances, it may be desirable to form an intervening layer between the substrate and a nanodot/matrix material layer. An intervening layer may be deposited on the substrate in step 415 prior to simultaneously depositing material 420 on the substrate. Deposition processes or other processes may be used to deposit an intervening layer as known. In some embodiments, a substrate may be provided 410 with intervening layers already formed on the substrate.

The simultaneous deposition of material 420 according to embodiments of the present invention can involve the simultaneous deposition of one or more nanodot materials and one or more matrix materials on a substrate substantially simultaneously. In some embodiments, the materials may be precursors of the nanodot materials and matrix materials. The simultaneous deposition of material 420 may be carried out using a pulsed laser deposition apparatus 300 as illustrated in FIG. 3. In order to simultaneously deposit multiple materials on a substrate, multiple targets 340 can be ablated simultaneously or alloy targets 340 including multiple materials may be ablated. Accordingly, in some embodiments of the present invention, energy from the excimer laser 320 may interact with an alloy target 340 including more than one material. In other embodiments, separate targets 340 may be ablated simultaneously with energy from two or more excimer lasers 320 interacting with the targets 340 simultaneously. In still other embodiments, the energy from an excimer laser 320 may be split into one or more paths to interact with one or more targets. For instance, a single laser beam may be split into two or more laser beams using a lens system or beam splitter such that each laser beam interacts with a separate target 340 in the deposition chamber 310. According to embodiments of the present invention, the excimer laser 320 produces high-powered nanosecond laser-pulses that interact with a target 340. Other techniques for exciting the targets 340 may be used in place of or in addition to the excimer laser 320, such as electron beam excitation and/or radio frequency excitation.

The interaction of energy from the excimer laser 320 or other energy source with a target 340 in the deposition chamber 310 can result in a nonequilibrium, evaporation of the surface layers of the target 340. The interaction of the evaporated material with the incident energy can result in the formation of a plasma of the target 340 material. The plasma contacts a substrate 110 in the deposition chamber 310 resulting in the deposition of a plasma material layer on the substrate. When an alloy target 340 is exposed to the energy to form a plasma, the various components of the alloy target 340 are deposited on the substrate 110. Similarly, if two or more targets 340 are engaged simultaneously by one or more energy sources, material from each target 340 will be deposited on the substrate 110.

Once deposited, the nanodot material and matrix material undergo a self-assembly process 430 wherein nanodots of the nanodot material self-assemble within the matrix material. During the self-assembly process, the matrix material and nanodot material are separated from each other. This occurs as the nanodot material clusters, forming spherically shaped nanodots within the matrix material. The clustering of the nanodot material is believed to result from a reduction in free energy of the layer of nanodot material and matrix material. At the same time, the matrix material reacts, such as by oxidation or nitridation. According to embodiments of the present invention, oxygen or nitrogen may be present in the deposition environment, which reacts with the matrix material, further separating the forming nanodot material from the matrix material.

According to some embodiments of the present invention, the simultaneous formation of nanodots in a matrix material depends upon the difference in the free energy of the nanodot material and the matrix material. For instance, a difference in the Gibb's free energy of oxidation may exist between the nanodot material and the matrix material. The nanodot material and matrix material can be selected such that the matrix material will form an oxide more rapidly than the nanodot material. The difference in free energy of oxidation of the nanodot material and the matrix material can be selected such that nanodots of the nanodot material will simultaneously form in a matrix material as the matrix material is oxidized without substantial oxidation of the nanodot material. For example, in some embodiments of the present invention the difference between the free energy of oxidation of the nanodot material and matrix material is selected to be about 100 kcal per mole. In other embodiments, the difference is between about 100 kcal per mole and about 200 kcal per mol. In still other embodiments, the free energy of oxidation difference may be about 150 kcal per mole at the fabrication pressure and temperature used to form the nanodots in the oxidized matrix material. The difference in the free energy of oxidation allows nanodots to form in an oxidizing matrix material without substantial oxidation of the nanodot material.

In other embodiments of the present invention the difference in free energy of the nanodot material and matrix material is not limited to the free energy of oxidation. For example, the free energy of nitridation may be selected, wherein the nanodot material and matrix material are selected based upon different rates of reaction of the nanodot material and matrix material with nitrogen. Other free energy differences may also be used to select the nanodot materials and matrix materials to form nanodot arrays and nanodot structures according to embodiments of the present invention.

Oxygen, or other gases, may be provided to the deposition chamber 310 through a port in the deposition apparatus 300. Alternatively or in addition, residual oxygen may be present in the atmosphere of the deposition chamber 310.

If additional layers of nanodots in matrix material are desired, the simultaneous deposition of material 420 and the self-assembly of the nanodots 430 may be repeated. For example, when using the apparatus illustrated in FIG. 3 to perform simultaneous nanodot formation according to embodiments of the present invention, the frequency and/or other parameters of an energy pulse from an excimer laser 320 or other energy source may be adjusted such that when the oxidation of a matrix material in a layer is complete, another layer of material is deposited. Matrix material atoms in the next layer are then oxidized and the nanodot material self-assembles based upon the free energy of the new layer and any interacting layers such as previously deposited layers. This process may be repeated until the desired number of nanodot layers has been achieved.

In other embodiments of the present invention, intervening layers may also be formed between nanodot and oxidized matrix material layers. For instance, an intervening layer of material may be deposited 435 after the self-assembly 430 of a nanodot and oxidized matrix material layer. An intervening layer may be deposited by exciting a target 340 of material within the deposition chamber 310 to form a plasma which settles on the substrate 110, forming an intervening layer. The simultaneous deposition of material 420 may then be repeated to form a new layer of nanodots and matrix material over the intervening layer.

Embodiments of the present invention may be used to form a plurality of nanodot and matrix material layers on a substrate. For instance, structures including three or more nanodot and matrix material layers may be constructed by repeating the simultaneous deposition of materials 420 and self-assembly 430 three or more times. In some embodiments, intervening layers of materials may also be included between the nanodot and matrix material layers. In other embodiments, the layers of nanodots and matrix materials may include one or more types of nanodot materials or matrix materials. For example, a structure may include a nanodot layer of a first material, a nanodot layer of a second material, and a nanodot layer of a third material.

According to embodiments of the present invention, the self-assembly of nanodots within a matrix material depends in part upon the difference in the free energy of a nanodot material and a matrix material. Some examples of nanodot materials and matrix materials that may be used with embodiments of the present invention follow, however, these examples are not meant to be limiting: nickel nanodots in an aluminum oxide ($Al_2O_3$) matrix; nickel/platinum nanodots in an $Al_2O_3$ matrix; cobalt/platinum nanodots in an $Al_2O_3$ matrix; iron/aluminum nanodots in an $Al_2O_3$ matrix; platinum nanodots in a nickel oxide (NiO) matrix; aluminum/platinum nanodots in a NiO matrix; aluminum/magnesium nanodots in a NiO matrix; nickel nanodots in a magnesium oxide (MgO) matrix; iron nanodots in a MgO matrix; nickel nanodots in a titanium nitride (TiN) matrix; and aluminum/platinum nanodots in an MgO matrix. Many other combinations of nickel, aluminum, platinum, magnesium, cobalt, and other metals may be used with embodiments of the present invention.

Other nanodot materials and matrix materials may also be used with embodiments of the present invention. For example, semiconductive materials may be deposited as nanodots according to embodiments of the present invention. Zinc oxides, gallium nitrides, and gallium arsenic may be used as nanodot materials. In addition, III–V semiconductive materials may be used. II–VI semiconductive materials may also be selected as the nanodot material. Matrix materials to be used with such nanodot materials may be selected based upon free energy differences between the nanodot material and the matrix material. For example, oxides, nitrides, and other matrix materials may be formed according to embodiments of the present invention.

The sizes and spacing of the nanodots and the rates and process of self-assembly may be altered by controlling the laser parameters, flux, surface energy of the structure, interfacial energy in the structure, substrate temperature, target composition, matrix material composition, and/or other parameters. For instance, the laser parameters that may be controlled include the wavelength of the laser, the pulse energy of the laser, and the repetition rate of the laser. In some embodiments, the laser wavelength may be adjusted between the ultra-violet range to the infrared range. The pulse energy density may adjusted from about 2 to about 10 $J/cm^2$ and the pulse duration set between about 1 nanosecond and 100 nanoseconds. The repetition rate of the laser may be between about 1 Hz and about 500 Hz.

The size and shape of the nanodots in the matrix material may also be altered by the selection and formation of the matrix material. Spherically shaped nanodots may be realized when the intervening matrix layers are amorphous. If the matrix material is crystalline, the nanodots may grow epitaxially by domain matching epitaxy, wherein the nanodots acquire a definite shape based upon the crystalline nature of the matrix material.

The following examples are provided for illustrative purposes only and are not meant to limit embodiments of the present invention.

EXAMPLE 1—SEQUENTIAL DEPOSITION

The sequential formation of self-assembled nickel nanodots and subsequent deposition of matrix materials was performed according to embodiments of the present invention.

Figure 6:
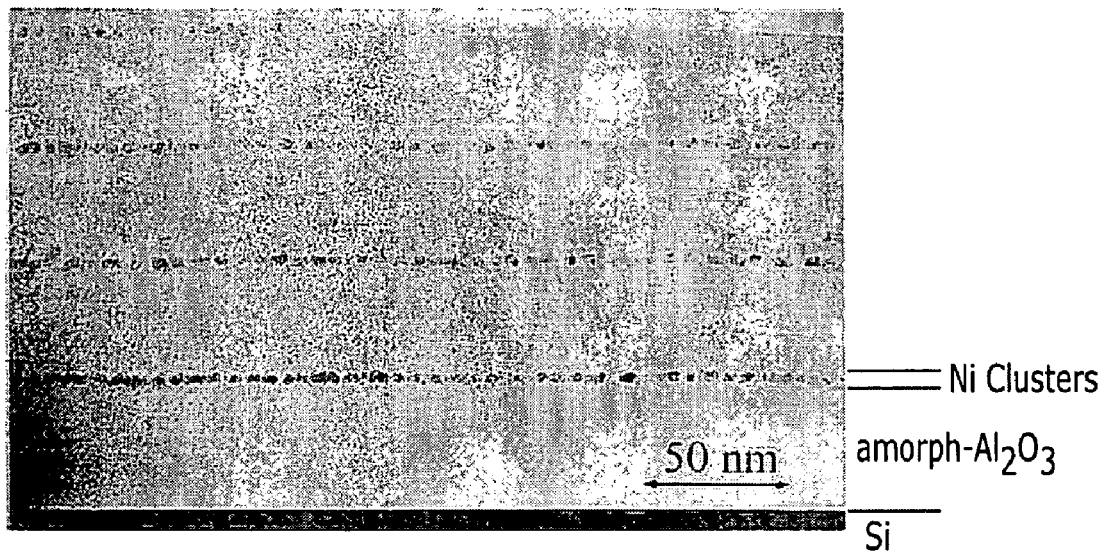
FIG. 6 illustrates a cross-sectional transmission electron microscope image of a nanodot structure formed according to embodiments of the present invention.

A cross-sectional transmission electron microscope image of a structure formed by the sequential deposition of a nickel nanodot material and the self-assembly of nickel nanodots followed by a deposition of an amorphous aluminum oxide matrix material is shown in FIG. 6. The self-assembled nickel nanodots in the nanodot clusters exhibit an average diameter of 10 nm and the separation between the nanodots is less than 1 nm. The size of the nickel nanodots is uniform, exhibiting a deviation of about 10 percent.

The structure shown in FIG. 6 was formed by the sequential deposition of nickel nanodots and aluminum oxide matrix material. The deposition was carried out on a silicon substrate at a temperature of about 500° C. in a high vacuum environment (approximately $5 \times 10^{-7}$ Torr) using an excimer laser with an energy density of about 2 $J/cm^2$ and a repetition rate of about 10 Hz.

Figure 7:
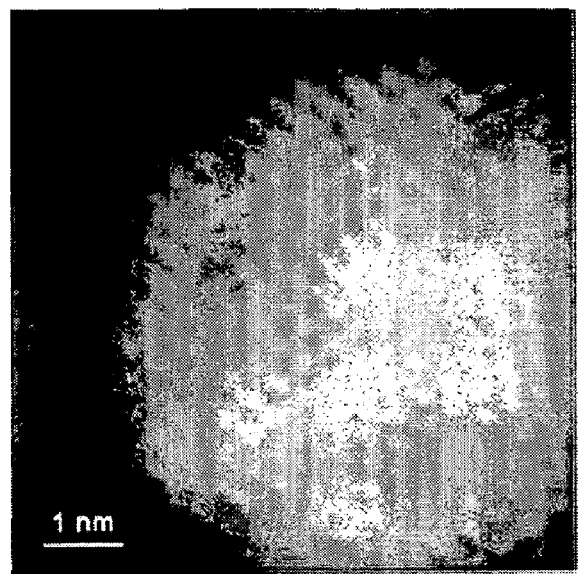
FIG. 7 illustrates a STEM-Z image of a nickel nanodot formed according to embodiments of the present invention.

A high resolution STEM-Z image of a nickel nanodot from the structure shown in FIG. 6. is shown in FIG. 7. The image reveals the detailed interfacial atomic structure between the nickel particles in the nickel nanodot and the amorphous alumina matrix material. Detailed electron energy loss spectroscopy (EELS) studies of the nickel nanodots in the structure of FIG. 6 showed no reaction between the nickel nanodots and the aluminum oxide matrix. The absence of reaction indicates that the magnetic properties of the nickel nanodots may be preserved in the structure.

Figures 8A, 8B:
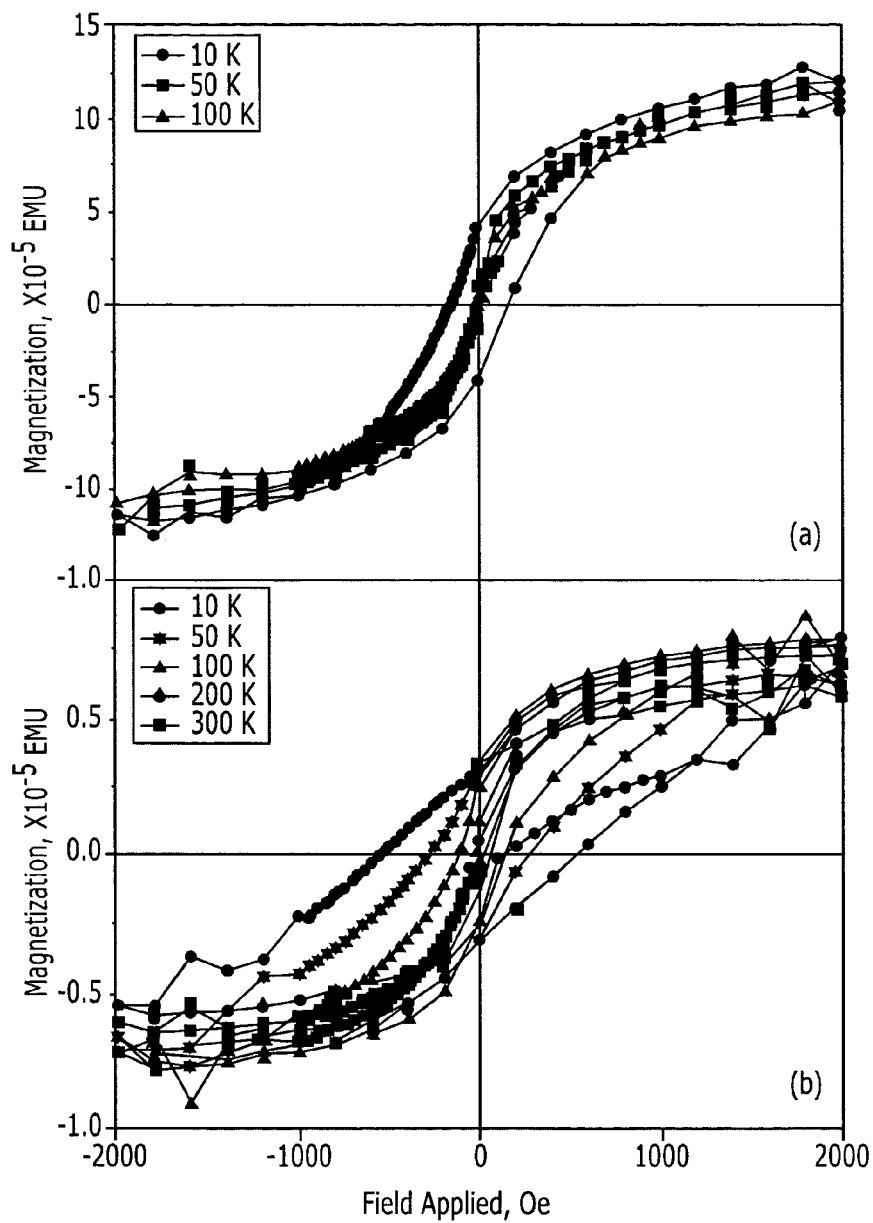
FIG. 8a illustrates a plot of magnetism versus field properties for nickel nanodots in an amorphous aluminum oxide matrix material according to embodiments of the present invention.
FIG. 8b illustrates a plot of magnetism versus field properties for nickel nanodots in a crystalline titanium nitride matrix material.
Figures 9A, 9B:
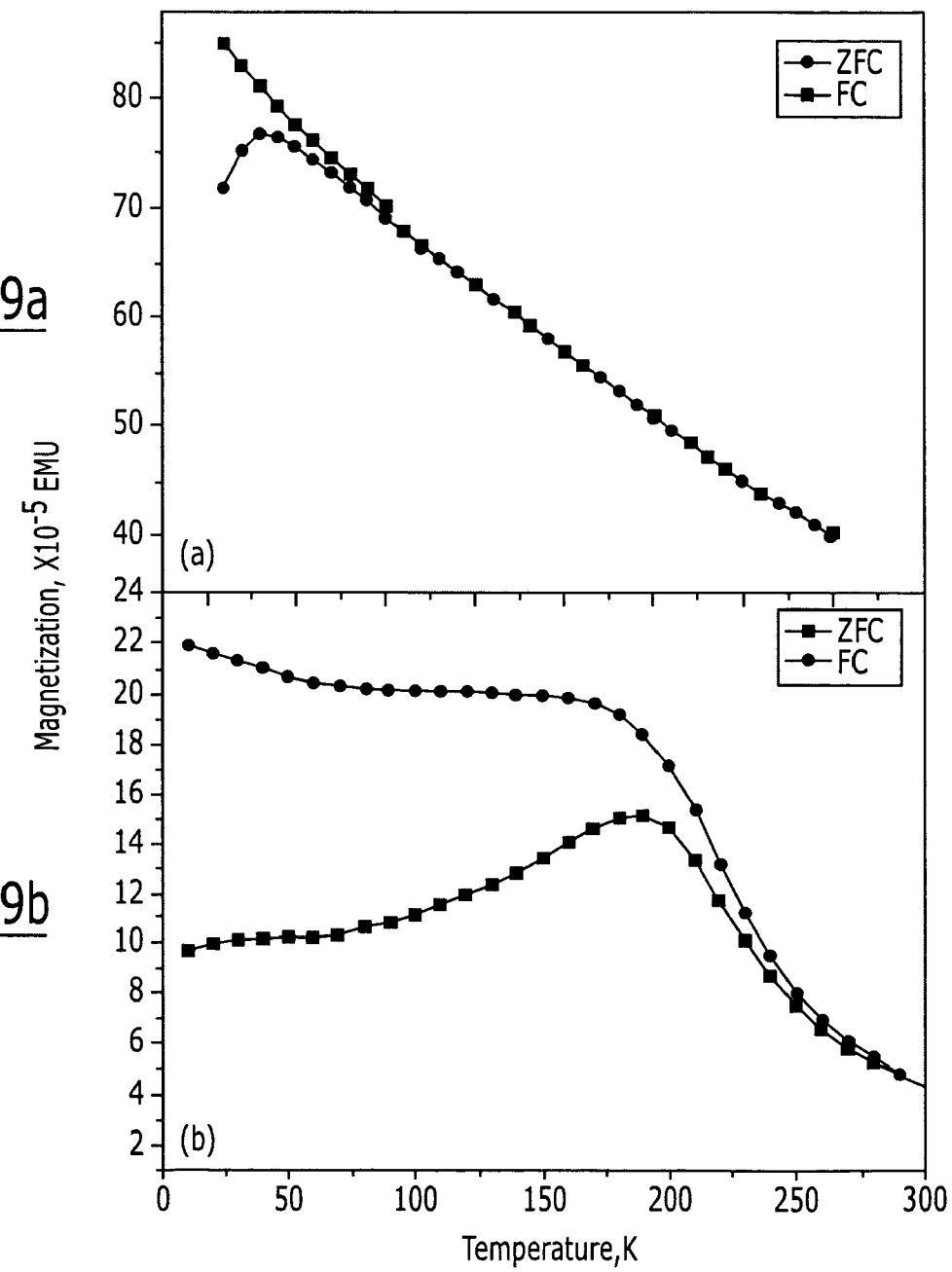
FIG. 9a illustrates a plot of magnetism versus temperature for nickel nanodots in an amorphous aluminum oxide matrix material according to embodiments of the present invention.
FIG. 9b illustrates a plot of magnetism versus temperature for nickel nanodots in a crystalline titanium nitride matrix material.

Structures formed according to embodiments of the invention, such as that shown in FIG. 6, were analyzed and plots of the magnetism of the nanoparticles in the matrix material were made against the field and temperature. Plots of magnetism (M) versus the field (H) and temperature (T) for the structures are shown in FIGS. 8 and 9 respectively. FIGS. 8a and 9a illustrate an M vs. H plot and an M vs. T plot for structures having nickel nanodots in an amorphous aluminum oxide matrix according to embodiments of the invention while FIGS. 8b and 9b illustrate an M vs. H plot and an M vs. T plot for structures having nickel nanodots in a crystalline titanium nitride matrix material according to embodiments of the present invention. The nickel nanodots in an aluminum oxide matrix exhibit coercivity (intercept in H-axis) below the blocking temperature $T_B$. The blocking temperature is a characteristic temperature below which the magnetic directions in individual nanodots essentially remain invarient. Above the blocking temperature, the magnetization is unstable and the sample loses any hysteric responses in magnetization versus field measurements. The M vs. T curves under a zero field cooled (ZFC) and field cooled (FC) conditions show a deviation below the blocking temperature $T_B$ consistent with the M vs. H curves in FIG. 8a. The crystalline titanium nitride matrix controls the orientation of the nickel nanodots and magnetically aligns the nickel nanodots. The magnetically aligned nanodots show a much higher coercivity and blocking temperature, as is illustrated in FIGS. 8b and 9b, than the nickel nanodots in the amorphous aluminum oxide matrix material where the nanodots are randomly oriented.

The methods for forming nanodot structures according to embodiments of the present invention allow the formation of the nanodots to be controlled. For instance, selecting different parameters and materials for the deposition of the nanodots and matrix materials may control the size, uniformity, alignment, and separation of the nanodots in the nanodot structure. The formation of amorphous or crystalline matrix materials may also be used to customize a nanodot structure. The methods of the present invention also allow a three-dimensional nanodot structure to be formed, such as structures having three or more layers of nanodots in a matrix material on one another.

EXAMPLE 2—SIMULTANEOUS DEPOSITION

The simultaneous formation of nickel nanodots in an aluminum oxide matrix on a substrate was performed according to embodiments of the present invention.

Figure 10:
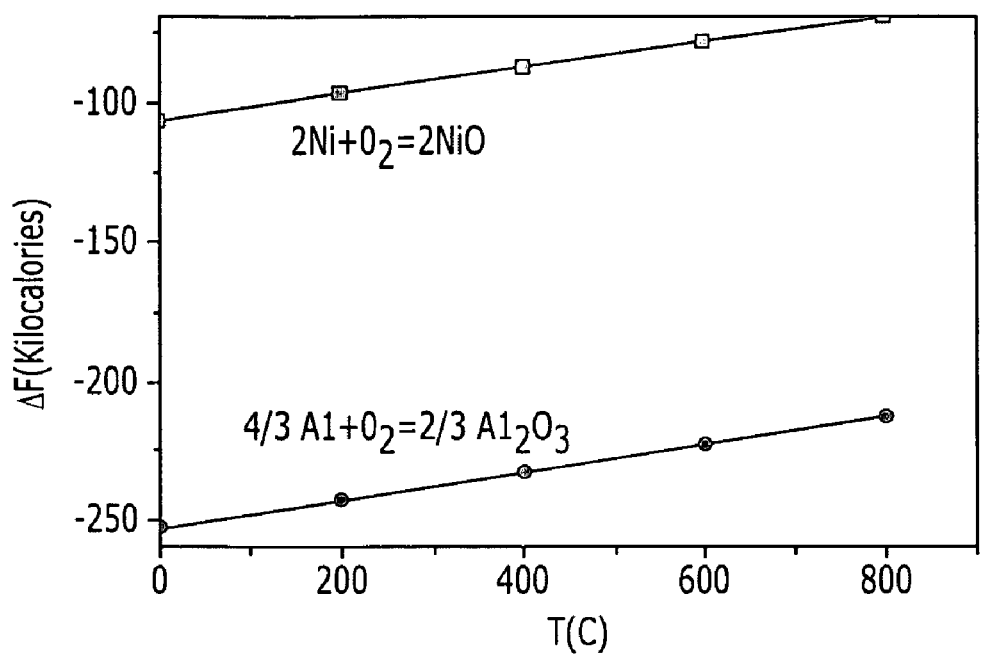
FIG. 10 illustrates a plot of the free energy of oxidation difference between nickel and aluminum.

A pulsed laser deposition apparatus 300, such as that illustrated in FIG. 3 was used to simultaneously deposit nickel nanodots in an aluminum oxide matrix material on a silicon substrate 110. The pulsed laser deposition apparatus 300 included a multi-target stainless steel deposition chamber 310, an excimer laser 320, and a turbo molecular pump 330 for maintaining a vacuum in the chamber. A controlled amount of oxygen was also added to the deposition chamber 310 through a controlled gas nozzle. A nickel/aluminum alloy target 340 was placed on a target support 342 parallel to a substrate 110 located on a heater plate 350. The target 340 selected was a commercially available nickel-aluminum alloy including 50 percent by weight nickel and 50 percent by weight aluminum. Nickel was selected as the nanodot material and aluminum as the precursor matrix material based on the difference in free energy of oxidation of the metals, which is illustrated in FIG. 10. The target 340 was positioned about 5 cm from the substrate 110. The substrate was a silicon substrate 110 and was maintained at a temperature of about 400° C. by passing a current through the heater plate 350.

A pulsed KrF excimer laser 320 having a wavelength of 248 nm was used to ablate the target by applying high-powered nanosecond excimer laser pulses to the target. The energy density and repetition rate of a pulsed laser beam produced by the pulsed KrF excimer laser 320 were 5 J/cm$^2$ and 15 Hz, respectively. The laser beam was incident on the target 340 at an angle of about 45 degrees.

The ablation of the target 340 produced a plasma of nickel and aluminum. A thin layer of nickel and aluminum was simultaneously deposited on the substrate 110. Following deposition, the nickel in the layer on the substrate formed nanodots while the aluminum matrix material oxidized in the presence of oxygen within the deposition chamber 310. The ablation of the target 340 was repeated to create additional layers of nickel and aluminum on the substrate 110, which also self-assembled to form a structure having multiple layers of nickel nanodots in an aluminum oxide matrix material. Transmission electron microscopy images of the structure formed according to embodiments of the present invention are illustrated in FIGS. 11a–11c.

The structure formed according to embodiments of the present invention was analyzed. The chemical composition, size distribution and microstructure of the nanodots and the surrounding matrix material formed according to this Example were determined using a cross-sectional scanning transmission electron microscopy with atomic number (Z) contrast (STEM-Z). I–V characteristics of the structures containing nanodots were determined by using a Kiethely Current source (Model 220) and a nanovoltmeter (Model-182). Low temperatures were achieved using a closed cycle refrigerator with a LakeShore temperature controller (Model-331). Electrical resistivity measurements were performed using a four-point-probe method and the measuring voltage was adjusted in such a way that the sample voltage was always less than 50 mV. Magnetic measurements were performed using a Quantum Design Squid Magnetometer in the temperature range of 10 K to 300 K.

Figure 11A:
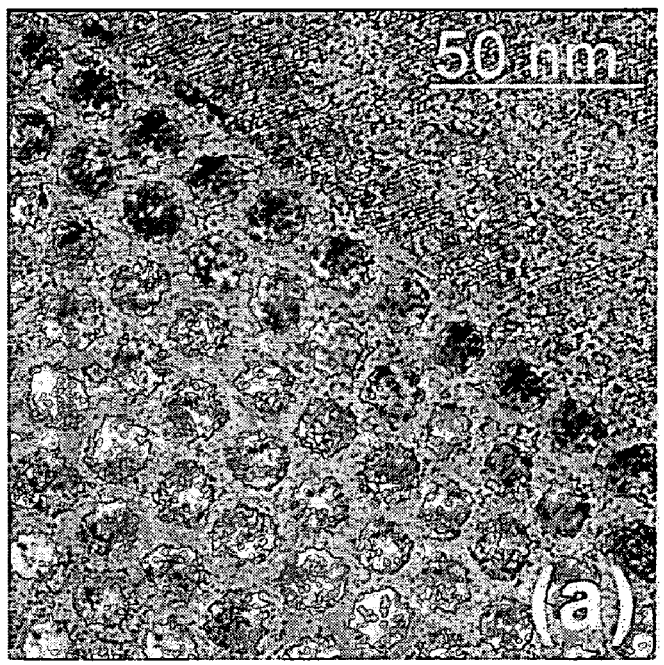
FIG. 11a illustrates a transmission electron microscope image of a nanodot structure formed according to embodiments of the present invnetion.

A transmission electron microscopy image of a structure formed according to embodiments of the present invention is illustrated in FIG. 11a. Uniformly distributed nanodots are clearly visible in FIG. 11a. The nanodots are spherical in shape and have a diameter of approximately 6 nm. The nanodots are uniformly spaced with the matrix material and include an average spacing of about 4 nm between each nanodot. The nanodots are arranged in a hexagonal pattern.

Figure 11B:
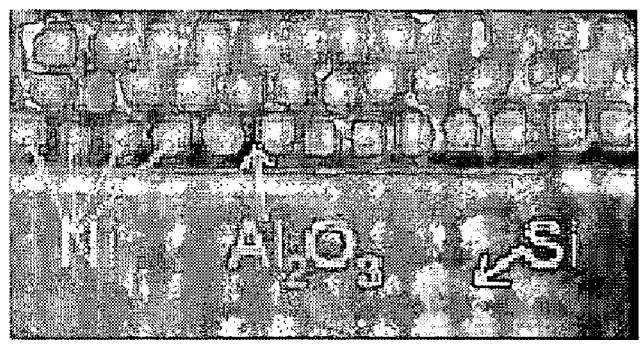
FIG. 11b illustrates a STEM-Z contrast image of a nanodot structure formed according to embodiments of the present invention.
Figure 11C:
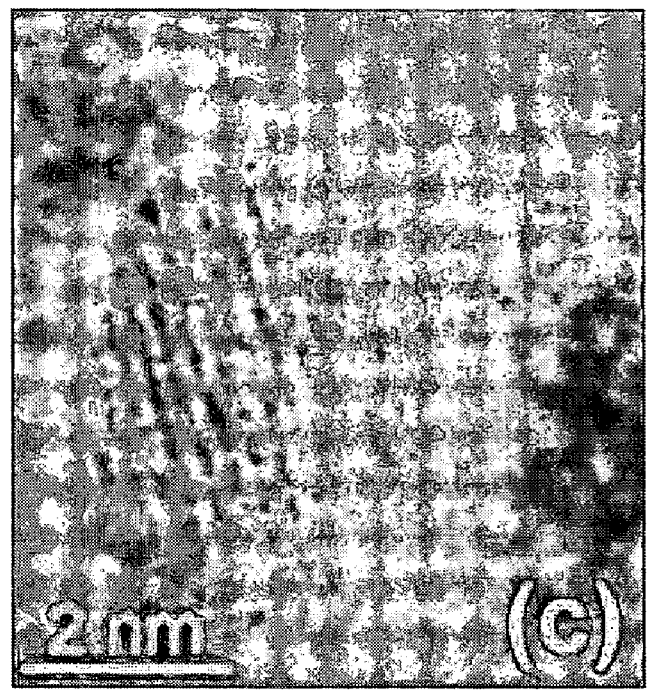
FIG. 11c illustrates a high-resolution transmission electron microscope image of a nickel nanodot in a nickel nanodot structure formed according to embodiments of the present invention.

FIG. 11b illustrates a STEM-Z contrast image of the structure. An EELS analysis showed that the nanodots were composed of metallic nickel while the surrounding amorphous matrix material was aluminum oxide. Because of the higher atomic number, the nickel nanodots are clearly distinguishable in the aluminum oxide matrix material illustrated in FIG. 11b.

FIG. 11c shows a high-resolution transition electron microscope image of a nickel nanodot formed according to embodiments of the present invention. It is clear from the image that the nickel nanodot is substantially crystalline and that it has a sharp interface with the aluminum oxide matrix material.

Figure 12:
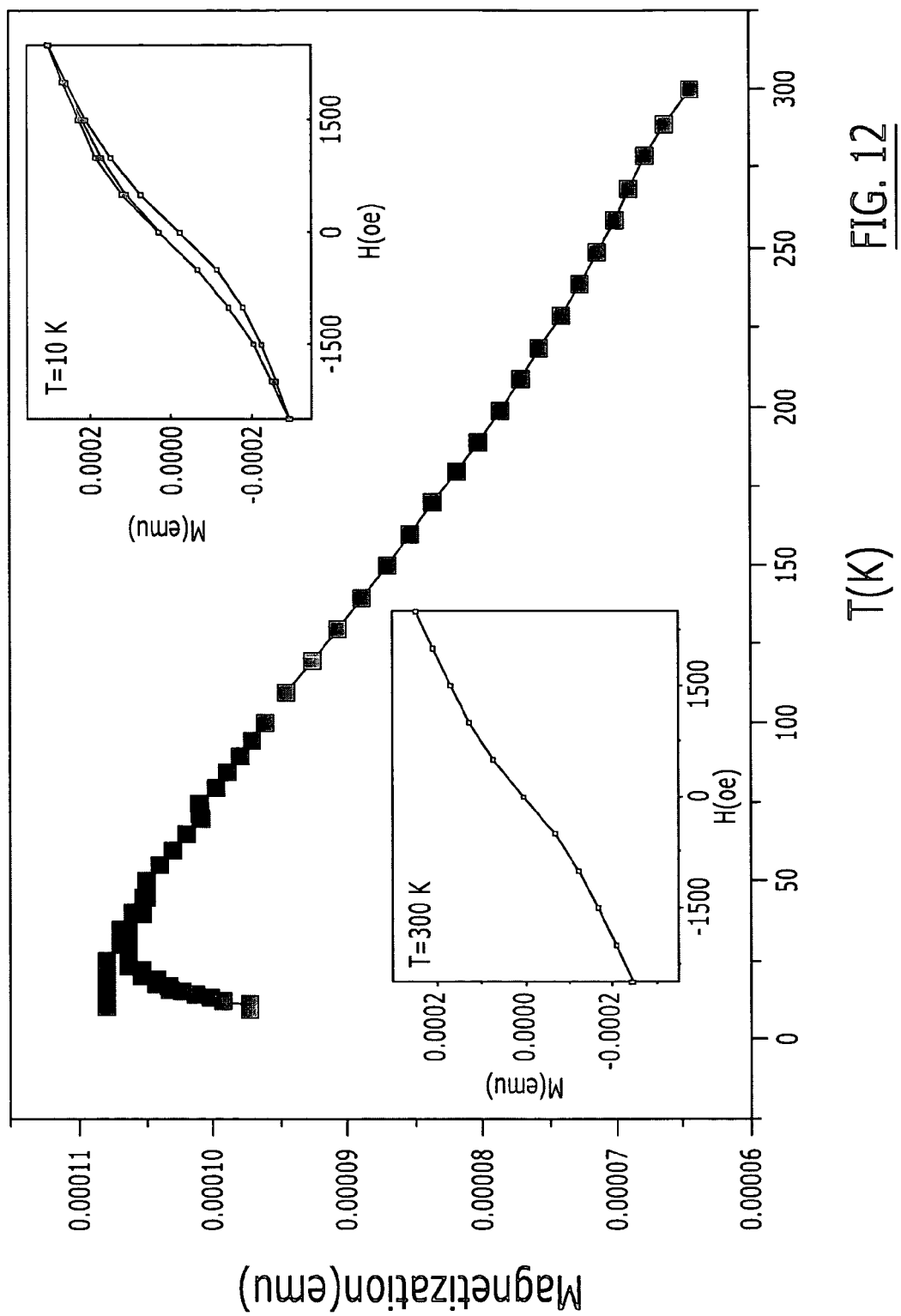
FIG. 12 illustrates a zero-field-cooled and field-cooled magnetization plot of a nanodot structure formed according to embodiments of the present invention.

FIG. 12 illustrates the zero-field-cooled (ZFC) and field-cooled (FC) magnetization of a nanodot and matrix material structure as a function of temperature. The zero-field-cooled measurements were performed by cooling the sample to 10 K in the absence of a magnetic field followed by warming it in a constant field with the magnetization being measured as a function of temperature. Measurements were then taken in a constant magnetic field. The FC magnetization was measured by cooling the sample to 10 K in the presence of magnetic field. In ZFC mode, as the temperature increases, the magnetization increases and then decreases at a particular temperature. In FC mode, the magnetization decreases monotonically with the increase in temperature. This magnetization behavior is a typical characteristic of superparamagnetic particles. Superparamagnetism arises in systems consisting of single domain particles of ferromagnets when the magnetic anisotropy energy becomes comparable with the thermal energy. In such systems, the ZFC magnetization shows a peak at a temperature known as the blocking temperature ($T_B$). Below the blocking temperature, magnetism (M) versus field (H) plots exhibit hysteresis with no hysteresis above the blocking temperature.

Insets of FIG. 12 show the M vs. H data taken at 10 K and 300 K. As illustrated, M vs. H shows hysteresis at 10 K while no such hysteresis is observed at 300 K. This is expected in accordance with the superparamagnetic nature of the system. An estimate of average maximum diameter of nanodots can be made from room temperature magnetization data using the expression:

$$D_{max} = \left[ \frac{18 k_B T}{\pi} \frac{(dM/dH)_{H=0}}{\rho M_s^2} \right]^{1/3},$$

where $D_{max}$ is the average maximum diameter, $k_B$ is the Boltzmann constant, T is the temperature (300 K), $\rho$ is the density of nickel (8.9 gm/cm$^3$), $(dM/dH)_{H=0}$ is the slope of the M vs. H curve near zero field and $M_s$ is the saturation magnetization. An estimation of the nanodot diameter in this case results in a value of $D_{max}$ equal to 5.5 nm, which is very close to value determined from the transmission electron microscope measurements.

The I–V characteristics of the structure of nickel nanodots in an aluminum oxide matrix according to embodiments of the present invention are illustrated in FIG. 13. At 300 K, the I–V characteristics are linear as shown in FIG. 13a. As the temperature decreases, the I–V curve starts deviating from the linear behavior. FIG. 13b shows the behavior of the I–V curve at 12 K, the lowest temperature tested for this example. According to theoretical predictions, the I–V characteristics of a uniform array of nanodots follows the relation $$I \propto \left( \frac{V}{V_0} - 1 \right)^\epsilon ; V > V_0,$$

where $V_0$ is a constant and $\epsilon$ is a scaling exponent. It has been reported that the value of $\epsilon$ for one-dimensional array of nanodots is 1, while, for two-dimensional arrays this value lies between 1.6 and 2. No predictions for the value of $\epsilon$ in three-dimensional nanodot arrays have been made. However, experimental measurements in granular three-dimensional systems formed by methods other than those of the present invention have shown the value of $\epsilon$ to lie between 2 and 3.5. The low temperature I–V data for this example fits very well in the above equation with fitting parameters $V_T$=20 mV and $\epsilon$=2.2. This value of $\epsilon$ suggests an array dimensionality somewhat higher than 2 and is consistent with three-dimensional geometry of nanodot arrays in this example.

For an array of metallic islands of magnetic material, the low field electrical conductance follows the relation: $\sigma \propto \exp(-2\kappa s - U/2k_B T)$; where s is the separation between two clusters, $\kappa = (2m\phi/h^2)^{1/2}$ and is the tunneling exponent of electron wave functions in the insulator, m is the effective electron mass, $\phi$ is the barrier height, U is the total required to create a pair of positive and negative charged nanodots, and T is the temperature. For magnetic islands the energy 'U' is the sum of electrostatic charging energy '$E_c$' and magnetic exchange energy '$E_m$'.

In the case of an array of identical nanodot clusters with identical intercluster distance such as in this example, the above equation reduces to a hopping expression: $\sigma \propto \exp(-U/2k_B T)$; while in the case of nanodots of varying sizes, electrical conductance follows a square root dependence: $\sigma \propto \exp(-\sqrt{U/2k_B T})$. The $T^{1/2}$ dependence of conductance is a characteristic feature of particle size nonuniformity in a system.

Figure 14:
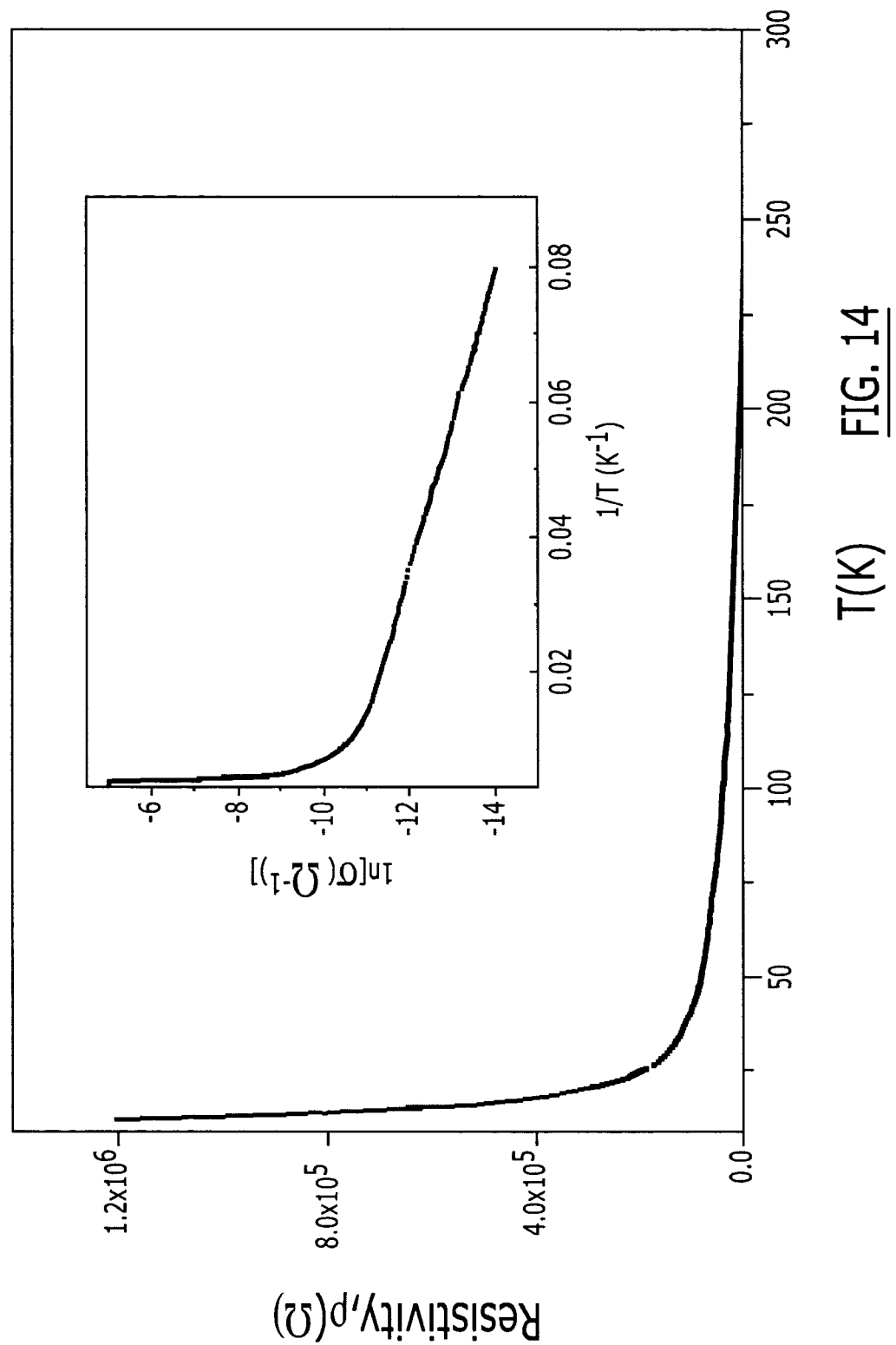
FIG. 14 illustrates a plot of the electrical resistance of a nanodot structure formed according to embodiments of the present invention.

In FIG. 14, the electrical resistance of a nickel nanodot and aluminum oxide matrix material structure according to this Example is illustrated for a temperature range between 12 and 300 K. The electrical resistance of the system increases monotonically with a decrease in temperature. The inset of FIG. 14 illustrates a plot of ln$\sigma$ vs. 1/T. As can be seen from this figure, ln$\sigma$ vs. 1/T follows a linear variation in the temperature range 12<T<90 K, confirming the underlying uniformity of the nanodot array. Using the linear part of the ln$\sigma$ vs. 1/T curve we estimated the activation energy U to be 4.5 meV, which corresponds to a temperature of approximately 50 K. This implies that for T>50 K, the charging energy of the nanodots is overcome by the thermal energy and hence the normal activation kind of electrical transport mechanism is restored in the system. As can be seen in the inset of FIG. 14, at higher temperature (T>100 K) the electrical conductivity increases much more abruptly with increase in temperature. By using the slope of the linear part of ln$\sigma$ vs. 1/T at higher temperatures we estimated the activation energy in this Example to be 0.2 eV.

Electrostatic charging energy '$E_c$' is related to the total capacitance of a nanodot to its surroundings 'C' by the relation $E_c = e^2/2C$. The value of 'C' can be estimated by using the expression $C \approx 2\pi n \epsilon_0 kr \ln(1 + 2r/d)$, where r is the radius of a nanodot, d is the interparticle distance, k is the dielectric constant of the surrounding insulating matrix and n is the number of nearest neighbors. In this Example, the radius r is approximately 3 nm, the interparticle distance d is approximately 4 nm and the number of nearest neighbors n is 9. Using a value of k=10 for aluminum oxide, C is approximately equal to $41 \times 10^{-18}$ F. This corresponds to the value of $E_c = e^2/2C = 1.9$ meV. Subtracting the value of $E_c$ from U we obtain $E_m$=2.6 meV, which corresponds to the inter-particle magnetic ordering temperature $T_m$ of approximately 30 K. This value is in agreement with the value of super-paramagnetic blocking temperature $T_B$ of approximately 32 K as determined by magnetic measurements of the structures of nanodot arrays formed according to this Example.

Therefore, according to embodiments of the present invention uniformly distributed nanodots may be self-assembled in a matrix material. In some embodiments, the self-assembly of the nanodots depends upon the free energy of the system and upon the difference in the Gibb's free energy of oxidation of the nanodot material and the matrix material. Nanodots may be self-assembled in a matrix material by selecting nanodot materials and matrix materials having a sufficient difference in free energy of oxidation. For example, nickel nanodots prepared according to embodiments of the present invention may be formed in an aluminum oxide matrix material. Multiple layers of the nanodots in a matrix material may be formed over one another to form a nanostructure having multiple layers of uniformly dispersed arrays of nanodots in matrix materials.

The nanodots and nanodot structures formed according to embodiments of the present invention may provide opportunities for reducing the size of magnetic storage media while significantly increasing the storage capacity of such devices. The structures may also be used for solid-state lighting devices, semiconductor devices, as well as many other uses.

Having thus described certain embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method for forming a nanostructure, comprising self-assembling a three-dimensional multi-layer nanodot arrays of uniform size in a matrix material from a nanodot material based upon a difference in Gibb's free energy of oxidation of the nanodot material and the matrix material.

2. The method of claim 1, wherein the difference in Gibb's free energy of oxidation between the nanodot material and the matrix material is at least 100 kcal per mole.

3. The method of claim 1, wherein the difference in Gibb's free energy of oxidation between the nanodot material and the matrix material is between about 100 kcal per mole and about 200 kcal per mole.

4. The method of claim 1, wherein the difference in Gibb's free energy of oxidation between the nanodot material and the matrix material is about 150 kcal per mole.

5. The method of claim 1, further comprising oxidizing the matrix material substantially simultaneously with the self-assembly of the nanodot array.

6. The method of claim 1, wherein self-assembling a nanodot array in a matrix material is performed repetitively to form a plurality of self-assembled nanodot arrays stacked on one another.

7. The method of claim 6, wherein at least three nanodot arrays are self-assembled on one another.

8. A method for promoting the self-assembly of nanodots, comprising:
providing a deposition apparatus having a deposition chamber;
providing a target comprising a nanodot material and a target comprising a matrix material within the deposition chamber;
providing a substrate within the deposition chamber;
forming a plasma of nanodot material in the deposition chamber by evaporating at least a portion of the target comprising a nanodot material, wherein the plasma forms at least one nanodot material containing monolayer on the substrate while forming a plasma of matrix material in the deposition chamber by evaporating at least a portion of the target comprising a matrix material, wherein the plasma forms a layer of matrix material on the substrate and any nanodots assembled thereon; and
allowing the at least one nanodot material containing monolayer on the substrate to self-assemble into nanodots of the nanodot material.

9. The method of claim 8, wherein said nanodot material comprises a nanodot material selected from the group consisting of nickel, nickel alloys, platinum, platinum alloys, aluminum, aluminum alloys, magnesium, magnesium alloys, iron, and iron alloys.

10. The method of claim 8, wherein forming a plasma of nanodot material and forming a plasma of matrix material are performed sequentially to form a plurality of alternating nanodot structures and matrix material layers wherein at least a portion of the matrix material layers are dispersed on the nanodots.

11. The method of claim 8, wherein the matrix material comprises a matrix material selected from the group consisting of aluminum, aluminum alloys, aluminum oxide, nickel, nickel alloys, nickel oxide, magnesium, and magnesium oxide.

12. The method of claim 8, wherein the Gibb's free energy of oxidation of the matrix material is lower than the Gibb's free energy of oxidation of the nanodot material.

13. The method of claim 8, wherein a difference between the Gibb's free energy of oxidation of the matrix material and the nanodot material is about 100 kcal per mole.

14. The method of claim 8, wherein a difference between the Gibb's free energy of oxidation of the matrix material and the nanodot material is about 150 kcal per mole.

15. The method of claim 8, wherein a difference between the Gibb's free energy of oxidation of the matrix material and the nanodot material is between about 100 kcal per mole and about 200 kcal per mole.

16. A method for forming nanodots on a substrate, comprising:
providing a deposition apparatus having a deposition chamber;
providing at least one substrate within the deposition chamber;
providing at least one target material within the deposition chamber;
ablating the at least one target material, wherein the ablation forms a plasma;
forming a layer of target material on the substrate; and
reacting oxygen with the layer of target material on the at least one substrate, wherein at least a portion of the oxygen reacts with a first portion of the target material to form a matrix material and a second portion of the target material self-assembles into nanodots.

17. The method of claim 16, wherein the at least one target material comprises a nanodot material and a matrix material.

18. The method of claim 17, wherein the nanodot material comprises a nanodot material selected from the group consisting of nickel, nickel alloys, platinum, platinum alloys, aluminum, aluminum alloys, magnesium, magnesium alloys, iron, and iron alloys.

19. The method of claim 17, wherein the matrix material comprises a matrix material selected from the group consisting of aluminum, aluminum alloys, aluminum oxide, nickel, nickel alloys, nickel oxide, magnesium, and magnesium oxide.

20. The method of claim 16, wherein the Gibb's free energy of oxidation of the first portion of the layer of target material is lower than the Gibb's free energy of oxidation of the second portion of the layer of target material.

21. The method of claim 16, wherein a difference between the Gibb's free energy of oxidation of the first portion of the layer of target material and the second portion of the layer of target material is about 100 kcal per mole.

22. The method of claim 16, wherein a difference between the Gibb's free energy of oxidation of the first portion of the layer of target material and the second portion of the layer of target material is about 150 kcal per mole.

23. The method of claim 16, wherein a difference between the Gibb's free energy of oxidation of the first portion of the layer of target material and the second portion of the layer of target material is between about 100 kcal per mole and about 200 kcal per mole.

* * * * *

UNITED STATES PATENT AND TRADEMARK OFFICE
CERTIFICATE OF CORRECTION

| | | |
|---|---|---|
| PATENT NO. | : 7,105,118 B2 | Page 1 of 1 |
| APPLICATION NO. | : 10/723842 | |
| DATED | : September 12, 2006 | |
| INVENTOR(S) | : Narayan et al. | |

It is certified that error appears in the above-identified patent and that said Letters Patent is hereby corrected as shown below:

In the Specification:
Column 1, Statement of Government Support, Lines 16-19,:

Please replace this section in its entirety with the following:

-- This invention was made with Government support under grant number 9706680 awarded by the National Science Foundation. The Government has certain rights in the invention. --

Signed and Sealed this
Twenty-fifth Day of February, 2014

Michelle K. Lee
*Deputy Director of the United States Patent and Trademark Office*